United States Patent
Kanelis

(10) Patent No.: US 6,791,183 B2
(45) Date of Patent: Sep. 14, 2004

(54) POWER SEMICONDUCTOR MODULE AND COOLING ELEMENT FOR HOLDING THE POWER SEMICONDUCTOR MODULE

(75) Inventor: Konstantinos Kanelis, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/026,107

(22) Filed: Dec. 24, 2001

(65) Prior Publication Data

US 2002/0093092 A1 Jul. 18, 2002

(30) Foreign Application Priority Data

Dec. 22, 2000 (DE) .......................................... 100 64 194

(51) Int. Cl.[7] .............................................. H01L 23/34
(52) U.S. Cl. ...................... 257/718; 257/712; 257/713; 257/719; 257/720
(58) Field of Search ................................ 259/712–713, 259/718–719, 731, 628, 684; 257/730, 720; 438/117; 361/676, 703, 704, 709

(56) References Cited

U.S. PATENT DOCUMENTS

| | | | | |
|---|---|---|---|---|
| 3,786,168 A | * | 1/1974 | Jaecklin et al. ............. | 174/16.3 |
| 4,415,025 A | * | 11/1983 | Horvath ....................... | 165/185 |
| 4,442,450 A | * | 4/1984 | Lipschutz et al. .......... | 257/713 |
| 4,734,139 A | * | 3/1988 | Shakun et al. .............. | 136/210 |
| 4,878,108 A | | 10/1989 | Phelps, Jr. et al. .......... | 257/796 |
| 5,184,211 A | * | 2/1993 | Fox ............................ | 257/706 |
| 5,296,739 A | * | 3/1994 | Heilbronner et al. ....... | 257/687 |
| 5,525,545 A | * | 6/1996 | Grube et al. ................. | 438/15 |
| 5,648,889 A | * | 7/1997 | Bosli ........................... | 361/704 |
| 5,705,853 A | * | 1/1998 | Faller et al. ................. | 257/719 |
| 5,748,456 A | * | 5/1998 | Bayerer ....................... | 361/820 |
| 5,801,330 A | * | 9/1998 | Gademann et al. ........ | 174/52.1 |
| 5,808,868 A | * | 9/1998 | Drekmeier ................... | 361/704 |
| 5,869,897 A | * | 2/1999 | Leighton et al. ............ | 257/727 |
| 5,926,369 A | * | 7/1999 | Ingraham et al. ........... | 361/699 |
| 5,985,697 A | * | 11/1999 | Chaney et al. .............. | 438/122 |
| 5,990,552 A | * | 11/1999 | Xie et al. .................... | 257/718 |
| 6,087,682 A | * | 7/2000 | Ando .......................... | 257/178 |
| 6,297,549 B1 | * | 10/2001 | Hiyoshi ....................... | 257/703 |
| 6,320,268 B1 | * | 11/2001 | Lang et al. .................. | 257/785 |
| 6,411,513 B1 | * | 6/2002 | Bedard ........................ | 361/704 |
| 6,441,520 B1 | * | 8/2002 | Grant ........................ | 310/68 R |
| 6,504,243 B1 | * | 1/2003 | Andric et al. ............... | 257/718 |
| 2002/0062855 A1 | * | 5/2002 | Chu et al. .................... | 136/230 |

FOREIGN PATENT DOCUMENTS

| | | |
|---|---|---|
| DE | 35 05 086 A1 | 8/1986 |
| DE | 296 01 776 U1 | 7/1996 |
| JP | 60111445 | 6/1985 |

* cited by examiner

*Primary Examiner*—Amir Zarabian
*Assistant Examiner*—Ida M. Soward
(74) *Attorney, Agent, or Firm*—Laurence A. Greenberg; Werner H. Stemer; Ralph E. Locher

(57) ABSTRACT

A power semiconductor module and a cooling element for holding the power semiconductor module are described. The power semiconductor module has a housing that has an underside and an upper side. At least one spring element projects from the upper side of the housing and is disposed on the upper side of the housing.

25 Claims, 4 Drawing Sheets

POWER SEMICONDUCTOR MODULE AND COOLING ELEMENT FOR HOLDING THE POWER SEMICONDUCTOR MODULE

BACKGROUND OF THE INVENTION

Field of the Invention

The present invention relates to a power semiconductor module and a cooling element for holding the power semiconductor module.

It is known to attach power semiconductor modules, in particular those for electric drives, to a cooling element by screws or clamps. The electronic components of the power semiconductor modules are surrounded here by a housing which is usually composed of a thermoplast and which is usually of a rectangular configuration. In order to attach the module, the housing is attached to the cooling element by screws or clamps. The connection which is formed by the respective type of attachment between the power semiconductor module and the cooling element must be so secure here that satisfactory thermal contact between the housing and the cooling element is established in order to ensure that heat is satisfactorily conducted away. In particular the attachment of the housing by screws, by which it is possible to realize good thermal contact between the housing and the cooling element, is complex in terms of fabrication technology and is therefore costly. The use of clamps for attaching the module permits rapid mounting but produces a less precise connection between the module and the cooling element.

SUMMARY OF THE INVENTION

It is accordingly an object of the invention to provide a power semiconductor module and a cooling element for holding the power semiconductor module which overcomes the above-mentioned disadvantages of the prior art devices of this general type, which can easily be attached to the cooling element and with which a satisfactory thermal connection between a housing of the power semiconductor module and the cooling element is ensured.

With the foregoing and other objects in view there is provided, in accordance with the invention, a power semiconductor module. The module contains a housing having an underside and an upper side; and at least one spring element projecting from the upper side and disposed on the upper side.

The module can be inserted into a cut-out of the cooling element provided for that purpose. The spring element which projects from the upper side of the module serves to clamp the module between an upper face and a lower face of the cut-out in the cooling element, in order to bring about good thermal contact between the module and the cooling element.

According to one embodiment of the invention, there is provision for the housing of the power semiconductor module to have at least two spring elements, one of which is disposed in the region of a first edge of the upper side and one in the region of a second edge of the upper side. Such a module can be inserted into a T-shaped groove of the cooling element that is provided for that purpose, the module being secured to the lateral cut-outs on both sides of such a T-shaped groove by the spring elements. Two spring elements are preferably formed in the region of each of the edges.

In a further embodiment of the invention, there is provision for the spring elements to be formed integrally onto the housing. The spring elements are then composed, as is the housing, of a material that is a good thermal conductor, in particular a thermoplast. This embodiment of the invention permits, on the one hand, a particularly satisfactory thermal contact between the spring elements and the rest of the housing, as a result of which the spring elements can also contribute to conducting away heat from the housing to the cooling element. On the other hand, a housing can be manufactured using an injection-molding method with integrally molded-on spring elements so that, compared with manufacturing the housing, no additional method steps are necessary to manufacture the spring elements.

The spring elements are each formed in an arcuate shape with a first end and a second end. The first ends are connected to the upper side of the housing and the second ends are disposed spaced apart from the upper side in a spring-mounted manner.

The housing of the power semiconductor module preferably has shoulders in the region of the edges, as a result of which an upper face and two lower faces of the upper side are formed. In this embodiment, the spring elements are disposed on the lower faces of the upper side in the region of the edges.

In order to ensure lateral stability of the power semiconductor module according to the invention which is inserted into the groove of the cooling element, in one further embodiment of the invention, projections, with which the power semiconductor module can bear against the cooling element, are provided on side faces which extend from the edges between the upper side and the underside of the housing.

A cooling element according to the invention for holding the power semiconductor module according to the invention preferably has a T-shaped groove formed in the body of the cooling element and into which the power semiconductor module can be inserted.

According to one embodiment, cooling ribs that enlarge the surface of the cooling element and thus bring about improved conduction of heat to the surroundings are formed on a surface of the cooling element facing away from the groove.

The cooling element is preferably manufactured from an extruded section, preferably composed of aluminum.

Other features which are considered as characteristic for the invention are set forth in the appended claims.

Although the invention is illustrated and described herein as embodied in a power semiconductor module and a cooling element for holding the power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
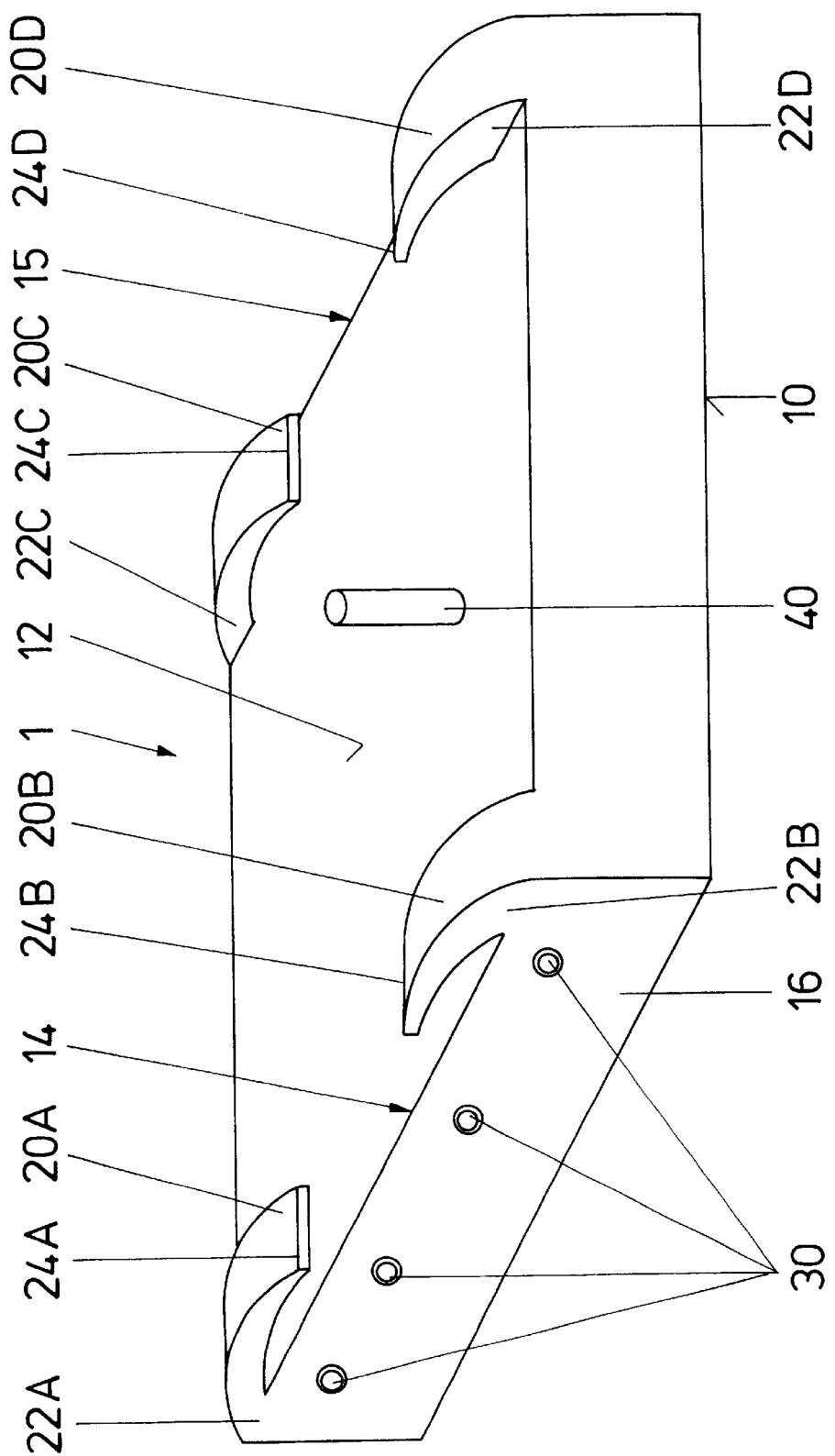
FIG. 1 is a diagrammatic, perspective view of a power semiconductor module according to a first embodiment of the invention.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of a power semiconductor module in accordance with the invention in a perspective view. The module has a housing 1, and in its interior, power semiconductor components for example IGBTs, power MOSFETs and if appropriate their drive circuits, are provided. The housing 1 according to the exemplary embodiment in FIG. 1 is essentially parallelepiped-shaped and has an underside 10 and an upper side 12 lying opposite the underside 10. According to the invention, spring elements 20A, 20B, 20C, 20D are formed on the upper side 12. The housing 1 of the power semiconductor module according to FIG. 1 has four of the spring elements 20A, 20B, 20C, 20D. In each case two spring elements 20A, 20B are disposed in a region of a first edge 14 of the upper side 12, and two further spring elements 22A, 22B are disposed in a region of a second edge 15 of the upper side 12. The first and second edges 14, 15 are located opposite the upper side 12.

The spring elements 20A–20D are each embodied in the example as elongated, arcuate elements which extend in the longitudinal direction along the edges 14, 15 and each have a first end 22A, 22B, 22C, 22D which is connected to the upper side 12. Second ends 24A, 24B, 24C, 24D are located spring-mounted above the upper side 12 as a result of the arcuate embodiment of the spring elements 20A–20D. The first ends 22A–22D are each formed in a corner of the upper side 12 between one of the edges and an edge running perpendicular thereto, in each case.

The housing 1 of the power semiconductor module is configured to be inserted into a cut-out or a groove in a cooling element, a lower face of the cut-out or groove engaging on the underside 10 of the housing 1, and the spring elements 20A–20D engaging on an upper face of the cut-out or groove in order to clamp the housing 1 between the lower face and the upper face so that in this way satisfactory thermal contact is established between the housing 1 and the cooling element.

The spring elements 20A–20D are preferably integrally formed onto the housing 1. In this way satisfactory thermal contact is ensured between the rest of the housing and the spring elements 20A–20D, as a result of which the spring elements 20A–20D also contribute to the conduction away of heat. The housing 1 is preferably composed of a thermoplast with which the power semiconductor components are encapsulated by injection molding to form the housing 1 so that the power semiconductor components are protected and sufficient mechanical stability of the configuration is ensured. In order to ensure that contact is formed on the power semiconductor components in the housing 1, there are usually cut-outs in the housing 1 from which connecting pins project 40, only one such connecting pin 40 for the power semiconductor components located in the interior of the housing 1 is illustrated by way of example in FIG. 1.

Figure 2:
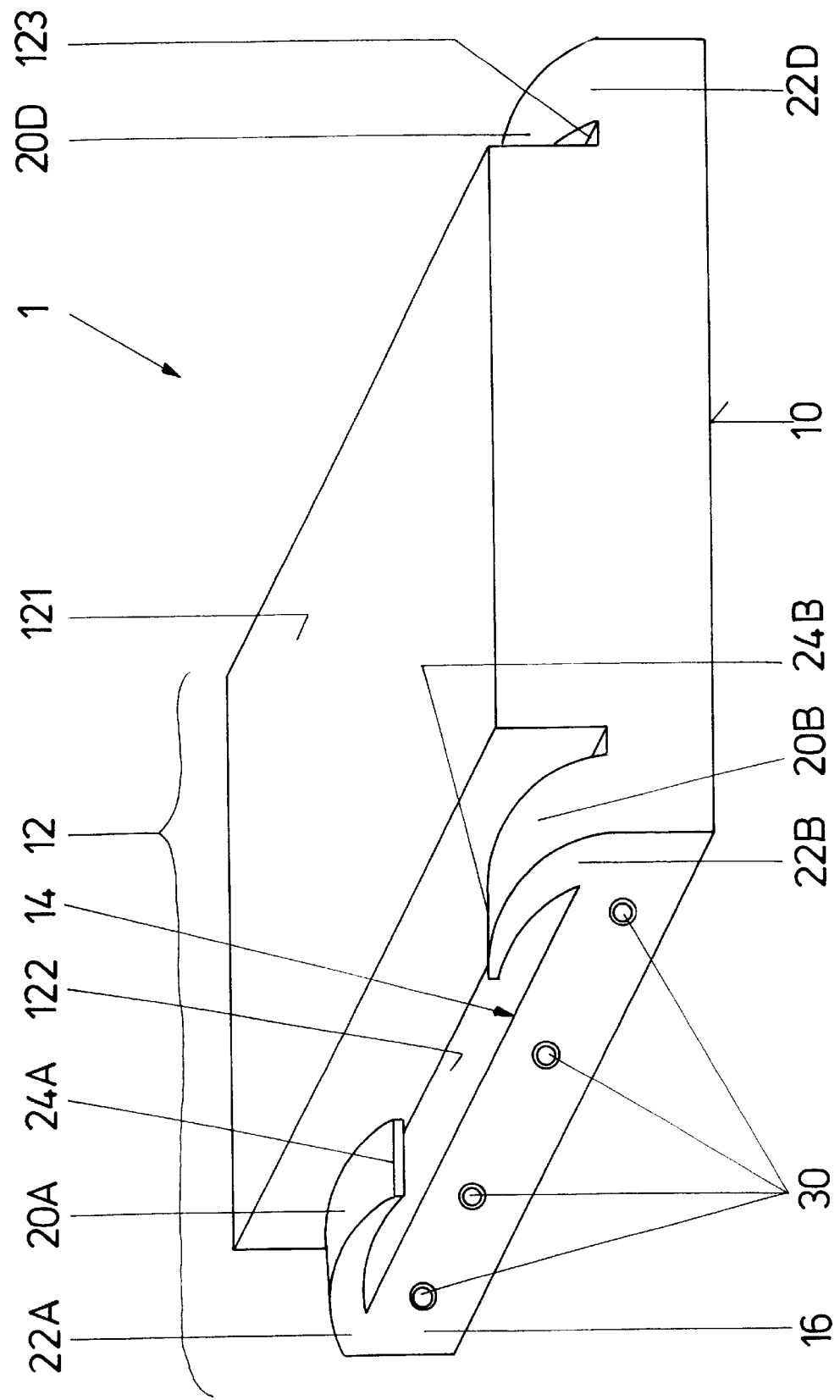
FIG. 2 is a perspective view of a second embodiment of the power semiconductor module.

FIG. 2 shows a further exemplary embodiment of the power semiconductor module according to the invention which differs from that illustrated in FIG. 1 in that shoulders are formed along the edges 14, 15 of the upper side 12, as a result of which the upper side 12 has a higher face 121 between the shoulders and respectively lower lying faces 122, 123 in the region of the shoulders. The spring elements, of which only the spring elements 20A, 20B, 20D are illustrated in FIG. 2, are formed here on the lower lying faces 122, 123.

Figure 3:
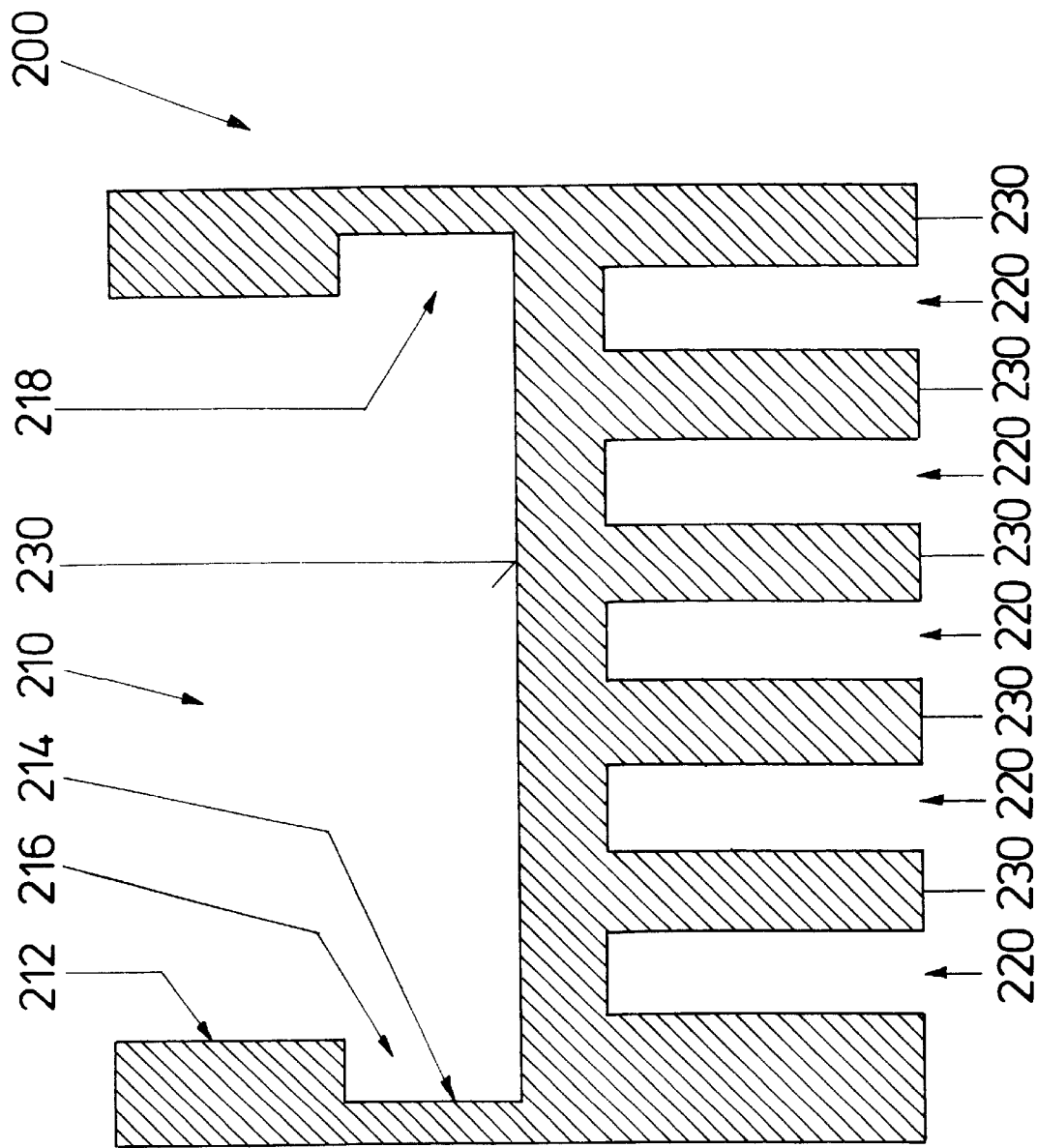
FIG. 3 is a cross-sectional view of a cooling element.

FIG. 3 shows an exemplary embodiment of a cooling element 200 according to the invention for holding the power semiconductor module according to the embodiments in FIGS. 1 and 2. The cooling element 200 is preferably composed of an extruded section and has a T-shaped groove 210 which is formed by two grooves 214, 212 which lie on top of one another, the lower groove 214 of which is wider than the upper groove 212 so that lateral recesses 216, 218 are formed. Cut-outs 220 are formed in the cooling element 200 on a side of the cooling element 200 lying opposite the T-shaped groove 210 in order to define cooling ribs 230 between the cut-outs 220. The cooling ribs 230 are used to enlarge the surface of the cooling element 200, resulting in improved conduction of heat away to the surroundings.

Figure 4:
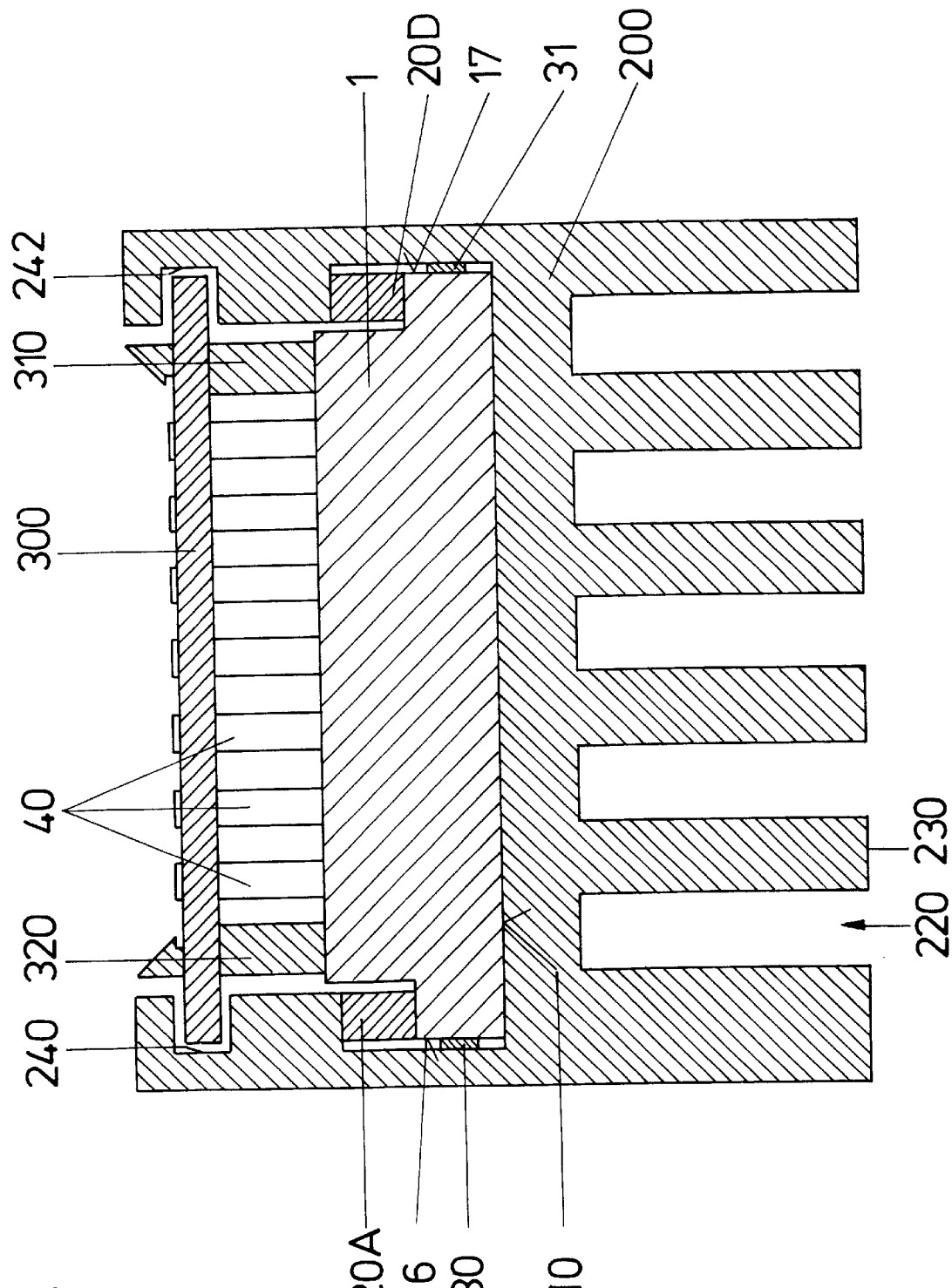
FIG. 4 is a sectional view of the power semiconductor module inserted into the cooling element.

FIG. 4 shows an embodiment of the cooling element 200 into which the power semiconductor module according to the exemplary embodiment in FIG. 2 is inserted. The lateral projections of the power semiconductor module formed by the shoulders, with the spring elements which are disposed thereon, of which only the spring elements 20A and 20D are illustrated in FIG. 4, are located in the recesses 216, 218 in the lower region of the T-shaped groove 210 of the cooling element 200, the underside 10 of the power semiconductor module is pressed against the cooling element 200 by the spring elements 20A, 20D. For this purpose, the spring elements 20A, 20D bear against faces of the recesses 216, 218 that lie opposite a base face of the cooling element 200 in the edge regions of the T-shaped groove 210. The arcuate shape of the spring elements 20A, 20D permits the power semiconductor module to be easily introduced into the T-shaped groove.

In order to stabilize the power semiconductor module transversely with respect to the insertion direction into the cooling element, projections 30 are formed on side faces 16, 17 which extend on the edges 14, 15 between the upper side 12 and the underside 10 of the module housing 1. The projections 30 are preferably dome-shaped in order to ensure satisfactory stabilization in the transverse direction without increasing the friction of the power semiconductor module with respect to the cooling element 200 in such a way that insertion of the housing 1 into the groove 210 of the cooling element 200 would be prevented owing to unavoidable tolerances during the manufacture of the cooling element 200 and/or of the groove 210 in the cooling element 200 and the housing 1.

The cooling element 200 according to FIG. 4 has lateral grooves 240, 242 in the upper region of the T-shaped groove 210, a printed circuit board 300, which is connected to the power semiconductor components in the housing 1 by contact pins 40 in the exemplary embodiment according to FIG. 4 are held in the lateral grooves 240, 242. The printed circuit board 300 and the lateral grooves 240, 242 are dimensioned in such a way that there is no contact between the printed circuit board 300 and the cooling element 200. The printed circuit board 300 is supported on the housing 1 by supporting elements 310, 320 which engage in cut-outs in the printed circuit board 300 and which are attached at one end lying opposite the printed circuit board 300 to the housing 1.

The power semiconductor module according to the invention can easily be attached to the cooling element 200 by merely inserting it into a groove provided for that purpose in the cooling element 200, while ensuring satisfactory thermal contact between the housing 1 and the cooling element 200. The power semiconductor module can also be manufactured by customary method steps in which power semiconductor components are encapsulated by injection molding with a thermoplast in order to form the housing 1, and all that is necessary is to provide a suitable mould so that a housing with the spring elements illustrated in FIGS. 1 and 2 is then produced within the scope of the injection molding method.

I claim:

1. A power semiconductor module, comprising:
   a cooling element having an opening formed therein;
   a housing having an underside and an upper side, said housing being disposed in said opening; and
   at least one spring element integrally formed on said upper side and projecting from said upper side, said at least one spring element pressing said underside of said housing against said cooling element, ensuring thermal contact between said underside and said cooling element.

2. The power semiconductor module according to claim 1, wherein:
   said housing has a first edge and a second edge; and
   said spring element is one of at least two spring elements, a first of said spring elements disposed in a region of said first edge on said upper side and a second of said spring elements disposed in a region of said second edge on said upper-side.

3. The power semiconductor module according to claim 2, wherein said two spring elements are two of four spring elements and a first two of said spring elements are formed in said region of said first edge and a second two of said spring elements are formed in said region of said second edge.

4. The power semiconductor module according to claim 3, wherein said spring elements are formed integrally onto said housing.

5. The power semiconductor module according to claim 3, wherein said spring elements are each formed in an arcuate shape with a first end and a second end, said first end connected to said upper side of said housing and said second end disposed spaced apart from said upper side in a spring mounted manner.

6. The power semiconductor module according to claim 3, wherein said housing has two sides opposite each other, and said upper side of said housing has a step formed therein in a region of each of said two sides of said housing, said step has an upper side and said spring elements are each disposed on said upper side of said step.

7. The power semiconductor module according to claim 6, wherein said housing has dome-shaped projections formed on at least one of said two sides, said sides extend between said first edge and said second edge and between said upper side and said underside.

8. The power semiconductor module according to claim 1, wherein said housing is composed of a thermoplast.

9. A cooling element for holding a power semiconductor module, comprising:
   a power semiconductor housing having an underside, an upper side, and at least one spring element projecting from said upper side and disposed on said upper side; and
   a cooling element body having a T-shaped groove formed therein for receiving said power semiconductor module, said at least one spring element pressing said underside of said power semiconductor housing against said cooling element, ensuring thermal contact between said power semiconductor housing and said cooling element.

10. The cooling element according to claim 9, wherein said cooling element body has cooling ribs extending from a surface of said cooling element body facing away from said groove.

11. The cooling element according to claim 9, wherein said cooling element body has an extruded section.

12. The power semiconductor module according to claim 1, wherein said housing is injection-molded.

13. The power semiconductor module according to claim 1, wherein said at least one spring element is an integrally molded-on spring element.

14. The power semiconductor module according to claim 1, wherein said housing contains a semiconductor component.

15. A power semiconductor module for placement in a cooling element, comprising:
   a housing having an underside and an upper side, and
   at least one spring element integrally formed on said upper side and projecting from said upper side for pressing said underside of said housing against the cooling element, ensuring thermal contact between said underside and the cooling element.

16. The power semiconductor module according to claim 15, wherein:
   said housing has a first edge and a second edge; and
   said spring element is one of at least two spring elements, a first of said spring elements disposed in a region of said first edge on said upper side and a second of said spring elements disposed in a region of said second edge on said upper side.

17. The power semiconductor module according to claim 16, wherein said two spring elements are two of four spring elements and a first two of said spring elements are formed in said region of said first edge and a second two of said spring elements are formed in said region of said second edge.

18. The power semiconductor module according to claim 17, wherein said spring elements are formed integrally onto said housing.

19. The power semiconductor module according to claim 17, wherein said spring elements are each formed in an arcuate shape with a first end and a second end, said first end connected to said upper side of said housing and said second end disposed spaced apart from said upper side in a spring mounted manner.

20. The power semiconductor module according to claim 17, wherein said housing has two sides opposite each other, and said upper side of said housing has a step formed therein in a region of each of said two sides of said housing, said step has an upper side and said spring elements are each disposed on said upper side of said step.

21. The power semiconductor module according to claim 20, wherein said housing has dome-shaped projections formed on at least one of said two sides, said sides extend between said first edge and said second edge and between said upper side and said underside.

22. The power semiconductor module according to claim 15, wherein said housing is composed of a thermoplast.

23. The power semiconductor module according to claim 15, wherein said housing is injection-molded.

24. The power semiconductor module according to claim 15, wherein said at least one spring element is an integrally molded-on spring element.

25. The power semiconductor module according to claim 15, wherein said housing contains a semiconductor component.

* * * * *